US012610658B2

(12) United States Patent
Chaji et al.

(10) Patent No.: US 12,610,658 B2
(45) Date of Patent: Apr. 21, 2026

(54) HIGH EFFICIENT MICRO DEVICES

(71) Applicant: VueReal Inc., Waterloo (CA)

(72) Inventors: Gholamreza Chaji, Waterloo (CA);
Ehsanollah Fathi, Waterloo (CA);
Hossein Zamani Siboni, Waterloo (CA)

(73) Assignee: VueReal Inc., Waterloo (CA)

( * ) Notice: Subject to any disclaimer, the term of this
patent is extended or adjusted under 35
U.S.C. 154(b) by 554 days.

(21) Appl. No.: 17/782,050

(22) PCT Filed: Dec. 3, 2020

(86) PCT No.: PCT/CA2020/051656
§ 371 (c)(1),
(2) Date: Jun. 2, 2022

(87) PCT Pub. No.: WO2021/108909
PCT Pub. Date: Jun. 10, 2021

(65) Prior Publication Data
US 2022/0416119 A1      Dec. 29, 2022

Related U.S. Application Data

(60) Provisional application No. 62/942,989, filed on Dec.
3, 2019.

(51) Int. Cl.
*H10H 20/812*      (2025.01)
*H01L 23/00*      (2006.01)
(Continued)

(52) U.S. Cl.
CPC ........ *H10H 20/812* (2025.01); *H10H 20/062*
(2025.01); *H10H 20/84* (2025.01);
(Continued)

(58) Field of Classification Search
CPC ..... H01L 33/06; H01L 33/0041; H01L 33/44;
H01L 24/06; H01L 24/14; H01L 23/481
See application file for complete search history.

(56) References Cited

U.S. PATENT DOCUMENTS 6,410,942 B1      6/2002  Thibeault et al.
2004/0217360 A1    11/2004  Negley
(Continued)

FOREIGN PATENT DOCUMENTS

JP      2007234808 A  *  9/2007
TW      201517253 A      5/2015

OTHER PUBLICATIONS

PCT International Search Report and Written Opinion relating to
PCT application No. PCT/CA2020/051656, dated Feb. 11, 2021.
(Continued)

*Primary Examiner* — David Vu
*Assistant Examiner* — Brandon C Fox

(57) ABSTRACT
The present disclosure relates to a solid state micro device
structure that has a microdevice formed on a substrate, with
p and n doped layers, active layers between at least the two
doped layers, pads coupled to each doped layer, and wherein
the n-doped layer is modulated to have a lower conductivity
towards an edge of the device. The invention further
involves, dielectric layer, conductive layer, passivation layer
and MIS structure.

26 Claims, 8 Drawing Sheets

(51) Int. Cl.

| | |
|---|---|
| *H01L 23/48* | (2006.01) |
| *H10H 20/00* | (2025.01) |
| *H10H 20/84* | (2025.01) |
| *H10H 29/14* | (2025.01) |
| *H10W 20/20* | (2026.01) |
| *H10W 72/20* | (2026.01) |
| *H10W 72/90* | (2026.01) |

(52) U.S. Cl.
CPC .......... *H10H 29/142* (2025.01); *H10W 20/20* (2026.01); *H10W 72/20* (2026.01); *H10W 72/90* (2026.01)

(56) References Cited

U.S. PATENT DOCUMENTS

| | | | |
|---|---|---|---|
| 2010/0171135 A1 | 7/2010 | Engl et al. | |
| 2012/0018764 A1* | 1/2012 | Choi ................. | H10H 20/8512 |
| | | | 257/E33.066 |
| 2014/0094878 A1* | 4/2014 | Gossler ................ | A61N 5/0601 |
| | | | 438/33 |
| 2015/0069523 A1 | 3/2015 | Or-Bach et al. | |
| 2015/0243848 A1 | 8/2015 | Huang | |
| 2016/0197238 A1 | 7/2016 | Jeong et al. | |
| 2018/0287021 A1* | 10/2018 | Chae ...................... | H01L 24/00 |
| 2018/0287027 A1* | 10/2018 | Chaji .................. | H10H 20/018 |
| 2019/0229097 A1* | 7/2019 | Takeya ................ | H01L 21/6835 |
| 2019/0288156 A1 | 9/2019 | Chaji et al. | |
| 2021/0098526 A1* | 4/2021 | Cho .................... | H01L 25/0753 |
| 2021/0367105 A1* | 11/2021 | Wang .................. | H10H 20/811 |
| 2022/0131032 A1* | 4/2022 | Tseng ................ | H10H 20/8162 |

OTHER PUBLICATIONS

CNIPA: CN Office Action relating to CN Office Action dated, May 29, 2025.
CNIPA: CN Office Action relating to CN Office application No. 202080082956.4 dated, Feb. 7, 2026.
ROC (Taiwan): TW Office Action relating to TW application No. 114128389, dated Jan. 13, 2026.

* cited by examiner

HIGH EFFICIENT MICRO DEVICES

FIELD OF THE INVENTION

The present invention pertains to vertical solid state devices, lateral conduction manipulation of vertical solid state devices, and methods of manufacture thereof. The present invention also relates to the fabrication of an integrated array of microdevices. The array of micro devices is defined by an array of contacts on a device substrate or a system substrate.

BACKGROUND

Integrating micro optoelectronic devices into a system substrate can offer high performance and high functionality systems. In order to improve the cost and create higher pixel density devices, the size of the optoelectronic devices should be reduced. Examples of optoelectronic devices are sensors and light emitting devices, such as, for example, light emitting diodes (LEDs). As the size of these devices is reduced, however, device performance can start to suffer. Some reasons for reduced performance include but are not limited to higher leakage current due to defects, charge crowding at interfaces, imbalance charge, and unwanted recombination's such as Auger and non-radiative recombination. Light Emitting Diodes (LED) and LED arrays can be categorized as a vertical solid state device. There remains a need for improved vertical solid state devices.

SUMMARY OF THE INVENTION

An object of the present invention is to provide a method of biasing the walls of a semiconductor device for passivating the defects and/or redirecting the current or balancing the charges in the said device.

The present invention also relates to a solid state micro device structure comprising, a microdevice formed on a substrate, p and n doped layers, active layers between at least the two doped layers while a pad is coupled to each doped layer, wherein the at least one of the doped layers is smaller than the active layer and within a perimeter of the active layer; and the two coupled pads are located on the same side where the doped layer is smaller. Additionally, wherein the n-doped layer is modulated to have a lower conductivity towards an edge of the device.

BRIEF DESCRIPTION OF THE FIGURES

The foregoing and other advantages of the disclosure will become apparent upon reading the following detailed description and upon reference to the drawings.

DETAILED DESCRIPTION OF THE INVENTION

Figure 1:
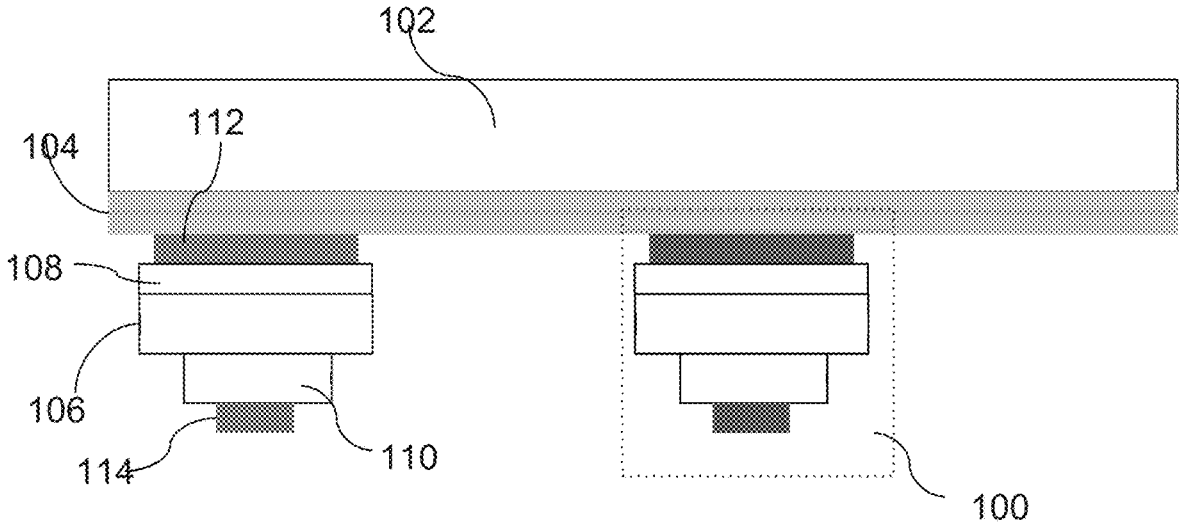
FIG. 1 shows a microdevice formed on a substrate.

Unless defined otherwise, all technical and scientific terms used herein have the same meaning as commonly understood by one of ordinary skill in the art to which this invention belongs. As used in the specification and claims, the singular forms "a", "an" and "the" include plural references unless the context clearly dictates otherwise. The term "comprising" as used herein will be understood to mean that the list following is non-exhaustive and may or may not include any other additional suitable items, for example one or more further feature(s), component(s) and/or element(s) as appropriate. The terms "device" and "micro device" and "optoelectronic device" are used herein interchangeably. It would be clear to one skill in the art that the embodiments described here are independent of the device size. The terms "donor substrate" and "temporal substrate" are used herein interchangeably. However, it is clear to one skilled in the art that the embodiments described herein are independent of the substrate. The terms "system substrate" and "receiver substrate" are used herein interchangeably. However, it is clear to one skill in the art that the embodiments described here are independent of substrate type.

Light Emitting Diodes (LED) and LED arrays can be categorized as a vertical solid state device. The micro devices may be sensors, Light Emitting Diodes (LEDs) or any other solid devices grown, deposited or monolithically fabricated on a substrate. The substrate may be the native substrate of the device layers or a receiver substrate where device layers or solid state devices are transferred to.

The system substrate may be any substrate and can be rigid or flexible. The system substrate may be made of glass, silicon, plastics or any other commonly used material. The system substrate may also have active electronic components such as but not limited to transistors, resistors, capacitors or any other electronic component commonly used in a system substrate. In some cases, the system substrate may be a substrate with electrical signal rows and columns. In one example, the device substrate may be a sapphire substrate with LED layers grown monolithically on top of it and the system substrate may be a backplane with circuitry to derive micro-LED devices. As part of the vertical devices, metal-insulator-semiconductor (MIS) structures can be formed from a layer of metal, a layer of insulating material and a layer of semiconductor material.

Various transferring and bonding methods may be used to transfer and bond device layers to the system substrate. In one example, heat and pressure may be used to bond device layers to a system substrate. In a vertical solid state device, the current flow in the vertical direction predominantly defines the functionality of the device. As Light Emitting Diodes (LED) may be categorized as a vertical solid state device, the proposed fabrication methods are used to limit the lateral current flow of these devices.

Patterning LED into micro size devices to create an array of LEDs for display applications comes with several issues including material utilization, limited PPI, and defect creation. In one example, in a vertical solid state device, the current flow in the vertical direction predominantly defines the functionality of the device.

The present invention relates to methods for lateral conduction manipulation of vertical solid state devices, particularly optoelectronic devices. More specifically, the present disclosure relates to micro or nano optoelectronic devices in which the performance of the device is being affected by reduction in size. Also described is a method of creating an array of vertical devices by modifying the lateral conduction without isolating the active layers. An array of LEDs using vertical conductivity engineering enables current transport in a horizontal direction and is controlled to the pixel area, so there is no need for patterning the LEDs.

In an embodiment presented in FIG. 1, a microdevice 100 is formed on a substrate 102. This process can be done by a deposition or a transfer or other forms. There can be a buffer/adhesion layer 104 between the microdevice 100 and the substrate 102. The microdevice has active layers 106 (multi-quantum wells, blocking layers, etc.), between p-doped and n-doped layers 108 and 110. Contact layers 112 and 114 are formed on the surface of doped layers 108 and 110. The contacts 112 and 114 can be a combination of ohmic layers and pad/bonding layers. In this structure, the n-doped layer 110 is modulated to have lower conductivity toward the edge of the device. In one case, the n-doped layer 110 is smaller than (inside) the active layers 106 surface and within a perimeter of the active layer. The blocking layer can also be etched back to be the same size of the doped layer 110. Passivation layer can be used to form on the surface/sidewall of the n doped layer and the exposed surface of the active layers. In one particular case, the passivation layer can be a form of metal insulator semiconductor (MIS) structure. In another embodiment, at least one of the doped layers is smaller than the active layer and the two pads are located on the same side where the doped layer is smaller.

Figure 2:
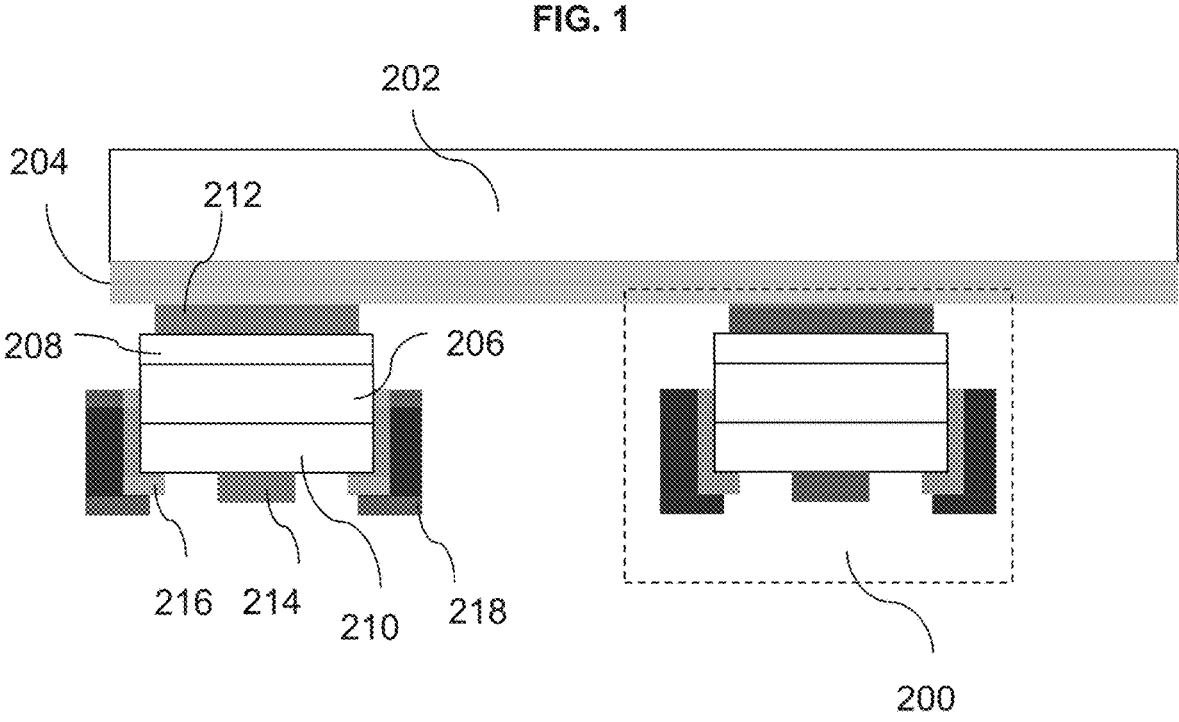
FIG. 2 shows a microdevice formed on a substrate with an MIS structure.

FIG. 2 presents a microdevice 200 formed on a substrate 202. here, there can be a buffer/adhesion layer 204 between the microdevice 200 and the substrate 202. The microdevice has active layers 206 (multi-quantum wells, blocking layers, etc.), between p and n doped layers 208 and 210. Contact layers 212 and 214 are formed on the surface of doped layers 208 and 210. The contacts 212 and 214 can be a combination of ohmic layers and pad/bonding layers. In this structure, insulator layer 216, and metal layer 218 form a MIS device. The MIS structure can be around the sidewall or surface of the n doped layer. It can cover the semiconductor (MIS) structure. The MIS can also cover the other layers such as active layers. The MIS can be biased with negative voltage to reduce the current through the n sidewalls. In one embodiment, the MIS is biased with a voltage smaller than a threshold voltage of the MIS to reduce a leakage current. The MIS structure presented in FIG. 2 can be applied to other devices and embodiments in this application.

Figure 3A:
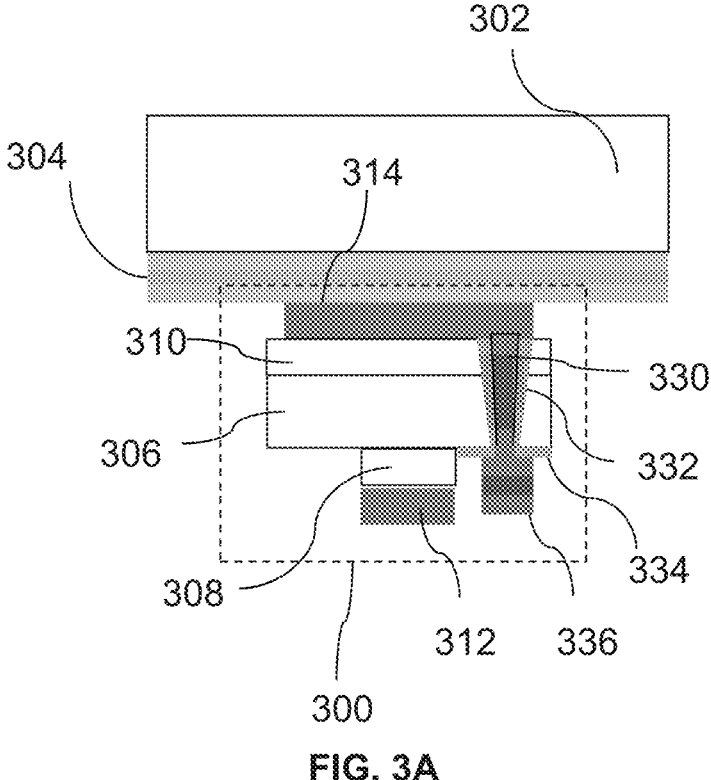
FIG. 3A shows a microdevice formed on a substrate with active layers and a VIA.

FIG. 3A presents a microdevice 300 formed on a substrate 302. Here, there can be a buffer/adhesion layer 304 between the microdevice 300 and the substrate 302. The microdevice has active layers 306 (multi-quantum wells, blocking layers, etc.), between p and n doped layers 308, and 310. Contact layers 312 and 314 are formed on the surface of doped layers 308 and 310. The contacts 312 and 314 can be a combination of ohmic layers and pad/bonding layers. In this structure, one of the doped layers 308 and 310 (e.g. n layer) is smaller than the active layers 306. Here, a VIA brings the contact from one side of the device to the other side. The VIA is passivated with dielectric layer 332 and conductive layer 330 coupled to the doped layer 310 (or in case there is a contact layer 314, the conductive layer 330 is coupled to the contact layer 314). In one case, where the conductive layer 330 coupled to the doped layer 310, it may contain an ohmic layer to create a better connection with the doped layer. Here there will be no passivation between the conductive layer 330 and the doped layer 310.

If the VIA is formed from the top side (side corresponding to the doped layer 310), or it is formed from the bottom side (the side corresponding to the doped layer 308), there can be some conductive layer 330 remaining outside the VIA at the bottom side after removing the doped layers from the VIA area. A pad 336 is formed to provide access to the conductive layer 330. The pad 336 is separated from the underneath layers by a dielectric layer 334.

Figure 3B:
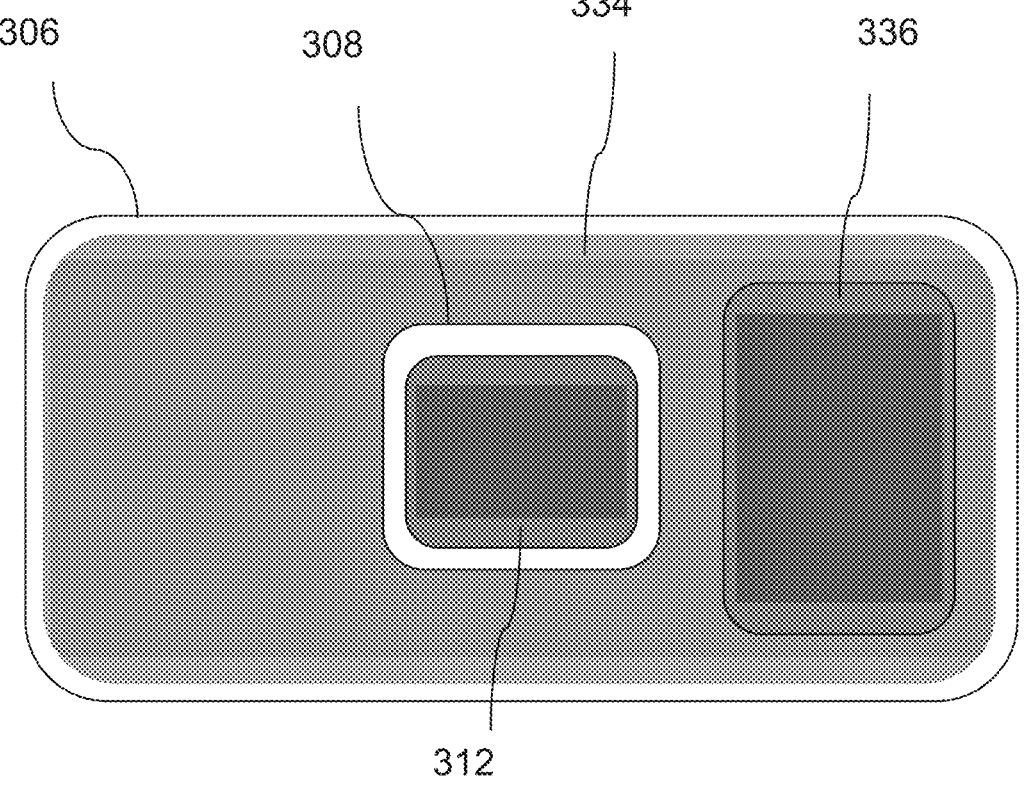
FIG. 3B shows a view of the microdevice in FIG. 3A from the bottom surface.

FIG. 3B shows a view of the microdevice 300 from the bottom surface. Here, the pads 312 and 336 can be used to connect or bond the microdevice to a system substrate. The dielectric layer 334 separating the pad 336 from the underneath layers 306 can be extended over the other part of the surface. The pad 312 can be smaller or larger than doped layer 308.

Figure 4A:
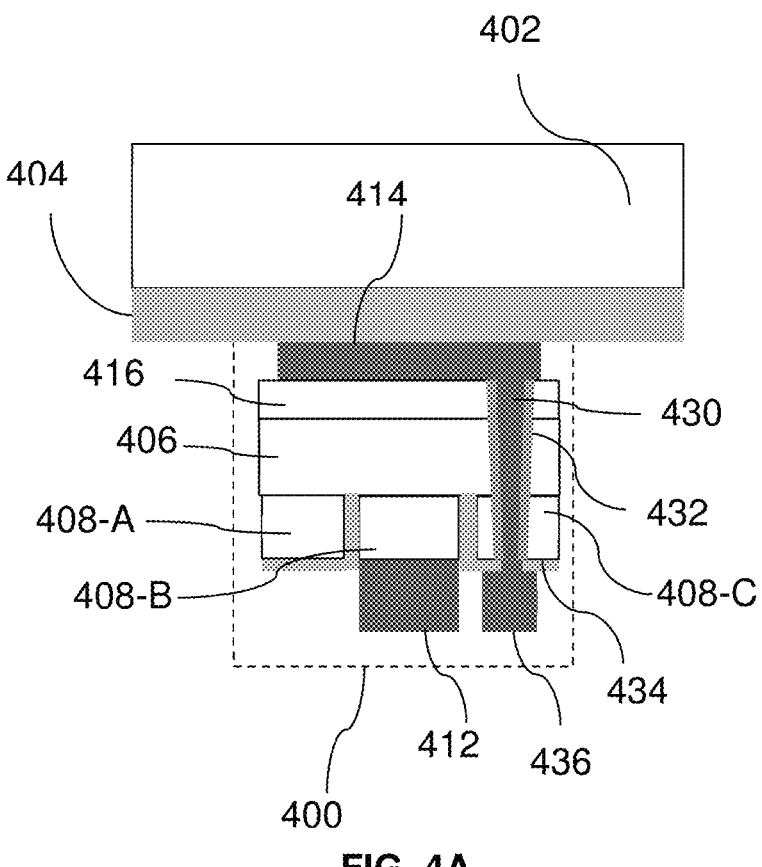
FIG. 4A shows a microdevice formed on a substrate with active layers, a VIA and patterned doped layer.

FIG. 4A presents a microdevice 400 formed on a substrate 402. Here, there can be a buffer/adhesion layer 404 between the microdevice 400 and the substrate 402. The microdevice has active layers 406 (multi quantum wells, blocking layers, etc.), between p and n doped layers 408, 410. Contact layers 412 and 414 are formed on the surface of doped layers 408 and 410. The contacts 412 and 414 can be a combination of ohmic layers and pad/bonding layers. In this structure, one of the doped layers 408 and 410 (e.g. n layer) is smaller than the active layers 406. The doped layer can be patterned into several smaller areas and one of the areas is used for connecting to the device through forming a pad 412 on top of it. The other areas can be used as stage for other parts. Here, a VIA brings the contact from side of the device to the other side. The VIA is passivated with dielectric layer 432 and conductive layer 430 coupled to the doped layer 410 (or in case there is a contact layer 414, the conductive layer 430 is coupled to the contact layer 414). In one case, where the conductive layer 430 is coupled to the doped layer 410, it may contain ohmic layer to create a better connection with the doped layer. Here there will be no passivation between the conductive layer 430 and the doped layer 410.

If the VIA is formed from the top side (side corresponding to the doped layer 410), or it is formed from the bottom side (the side corresponding to the doped layer 408), there can be some conductive layer 430 remain outside the VIA at the bottom side after removing the doped layers from the VIA area. A pad 436 is formed to provide access to the conductive layer 430. The pad 436 is separated from the underneath layers by a dielectric layer 434. If the pad 436 does not for an ohmic layer with doped layer 408-C, the dielectric layer 436 can be ignored.

Figure 4B:
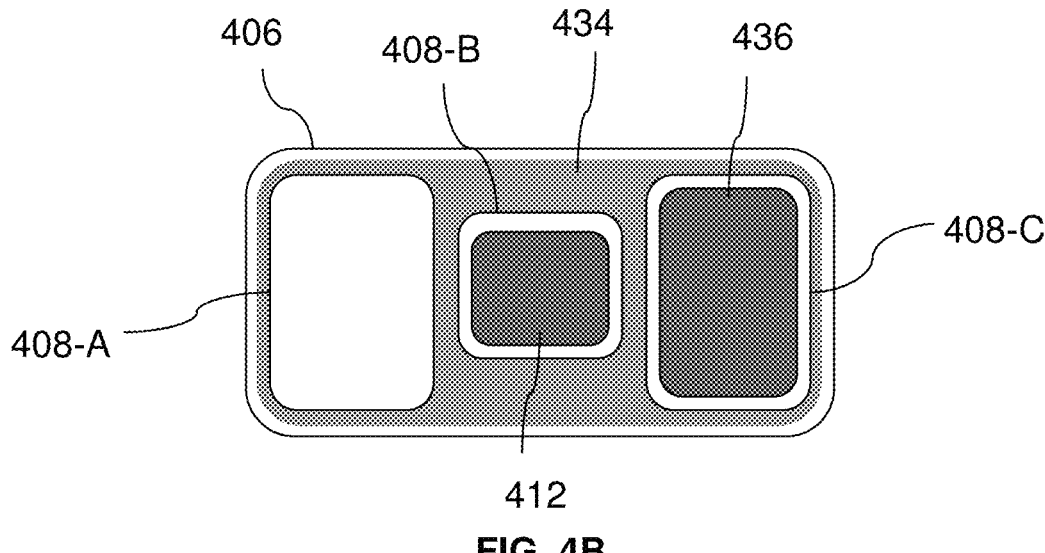
FIG. 4B shows a view of the microdevice in FIG. 4A from the bottom surface.

FIG. 4B shows a view of the microdevice 400 from the bottom surface. Here, the pads 412 and 436 can be used to connect or bond the microdevice to a system substrate. the dielectric layer 434 separating the pad 436 from the underneath layers 408-C can be extended over the other part of the surface. The pad 412 can be smaller or larger than doped layer 408-B. Other part of the doped layer 408-A, 408-C can be used for staging or no use. Some of the parts can be continuous. Some parts can be connected to a voltage for modulating the internal field for microdevice 400 for better performance.

Figure 5A:
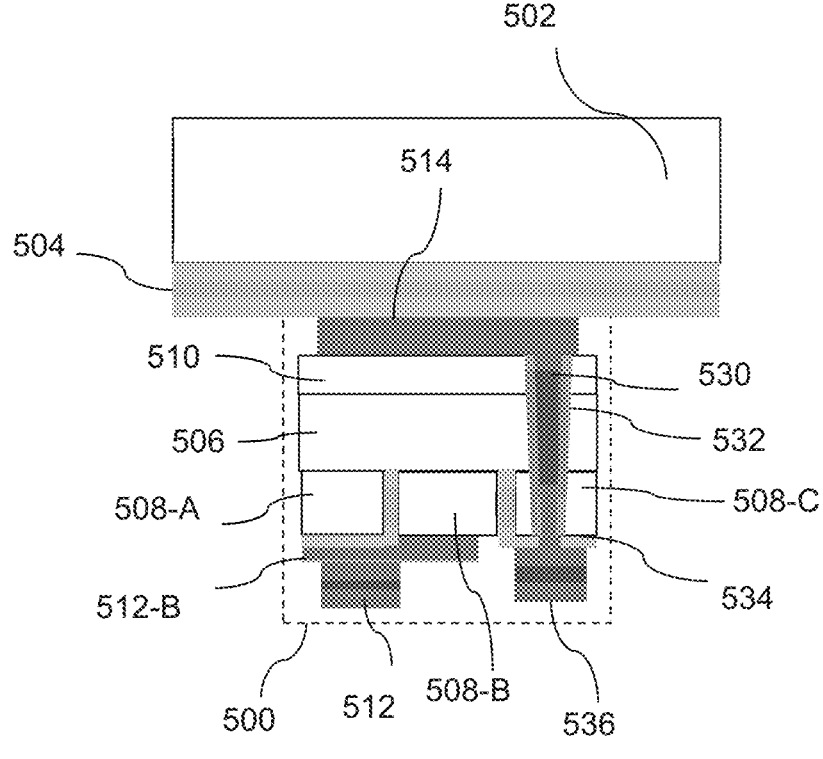
FIG. 5A shows a microdevice formed on a substrate with active layers, a VIA and patterned doped layer connecting to the device through forming a pad.

FIG. 5A presents a microdevice 400 formed on a substrate 502. Here, there can be a buffer/adhesion layer 504 between the microdevice 500 and the substrate 502. The microdevice has active layers 506 (multi quantum wells, blocking layers, etc.), between p and n doped layers 508 and 510. Contact layers 512 and 514 are formed on the surface of doped layers 508 and 510. The contacts 512 and 514 can be a combination of ohmic layers and pad/bonding layers. In this structure, one of the doped layers 508 and 510 (e.g. n layer) is smaller than the active layers 506. The doped layer can be patterned into several smaller areas and one of the areas is used for connecting to the device through forming a pad 512A and connecting it through a conductive/ohmic layer 512-B extending over the top of the intended area of doped layer. The other parts can be used as stage for other parts. Here, a VIA brings the contact from one side of the device to the other side. The VIA is passivated with dielectric layer 532, and conductive layer 530 coupled to the doped layer 510 (or in case there is a contact layer 514, the conductive layer 430 is coupled to the contact layer 514). In one case, where the conductive layer 530 is coupled to the doped layer 510, it may contain ohmic layer to create a better connection with the doped layer. And there will be no passivation between the conductive layer 530 and the doped layer 510.

If the VIA is formed from the top side (side corresponding to the doped layer 510), or it is formed from the bottom side (the side corresponding to the doped layer 508), there can be some conductive layer 530 remaining outside the VIA at the bottom side after removing the doped layers from the VIA area. A pad 536 is formed to provide access to the conductive layer 530. The pad 536 is separated from the underneath layers by a dielectric layer 534. If the pad 536 does not form an ohmic layer with doped layer 508-C, the dielectric layer 536 can be ignored.

Figure 5B:
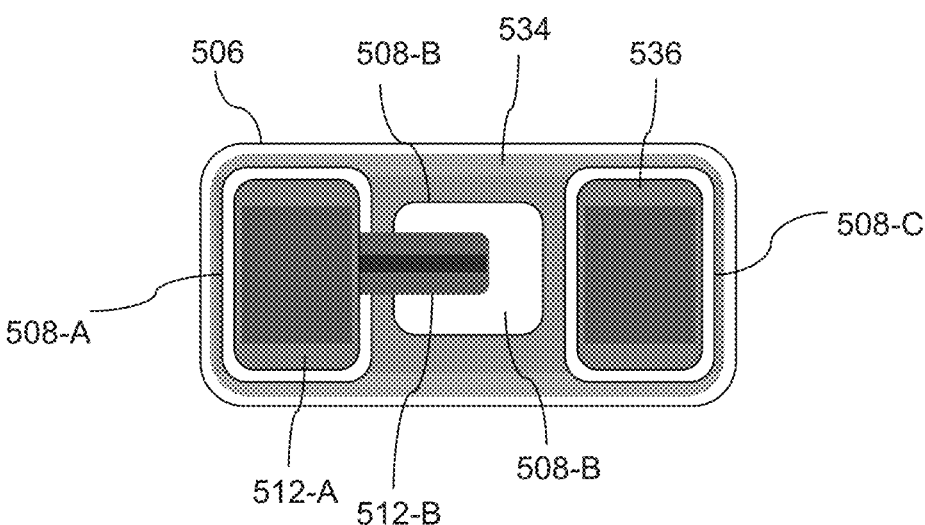
FIG. 5B shows a view of the microdevice in FIG. 5A from the bottom surface.

FIG. 5B shows a view of the microdevice 500 from the bottom surface. Here, the pads 512 and 536 can be used to connect or bond the microdevice to a system substrate. the dielectric layer 534 separating the pad 536 from the underneath layers 508-C can be extended over the other part of the surface. The pad 512 can be smaller or larger than doped layer 508-B. Other part of the doped layer 508-A, 508-C can be used for staging or no use. some of the parts can be continuous. Some parts can be connected to a voltage for modulating the internal field for microdevice 500 for better performance.

Figure 6A:
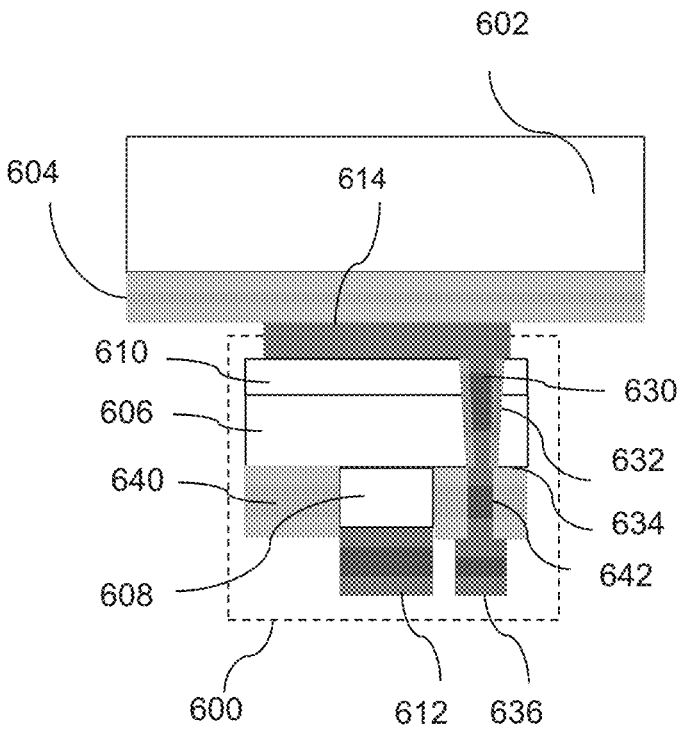
FIG. 6A shows a microdevice formed on a substrate with active layers, a VIA and doped layer where one of the doped layers is smaller than the active layer.

FIG. 6A presents a microdevice 600 formed on a substrate 602. Here, there can be a buffer/adhesion layer 604 between the microdevice 600 and the substrate 602. The microdevice has active layers 606 (multi quantum wells, blocking layers, etc.), between p and n doped layers 608 and 610. Contact layers 612 and 614 are formed on the surface of doped layers 608 and 610. The contacts 612 and 614 can be a combination of ohmic layers and pad/bonding layers. In this structure, one of the doped layers 608 and 610 (e.g. n layer) is smaller than the active layer 606. A planarization/passivation layer 640 can cover the bottom surface of the microdevice (it can leave the surface of the doped layer 608 exposed). Here, a VIA brings the contact from one side of the device to the other side wherein part of the VIA 642 is inside the planarization layer. The VIA is passivated with dielectric layer 632, and conductive layer 630 coupled to the doped layer 610 (or in case there is a contact layer 614, the conductive layer 630 is coupled to the contact layer 614). In case, where the conductive layer 630 coupled to the doped layer 610, it may contain an ohmic layer to create a better connection with the doped layer. Here there will be no passivation between the conductive layer 630 and the doped layer 610.

If the VIA is formed from the top side (side corresponding to the doped layer 610), or it is formed from the bottom side (the side corresponding to the doped layer 608), there can be some conductive layer 630 remain outside the VIA at the bottom side after removing the doped layers from the VIA area. A pad 636 is formed to provide access to the conductive layer 630. The pad 636 is separated from the underneath layers by a dielectric layer 634. If the pad 636 does not form an ohmic layer with doped layer 608-C, the dielectric layer 636 can be ignored.

Figure 6B:
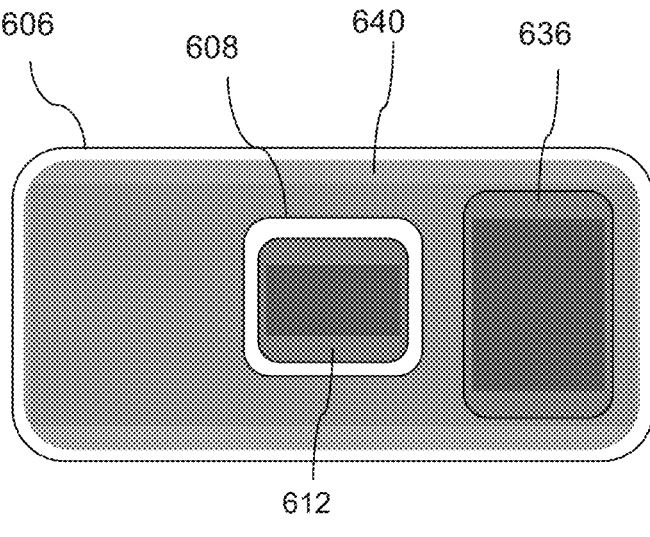
FIG. 6B shows a view of the microdevice in FIG. 6A from the bottom surface.

FIG. 6B shows a view of the microdevice 600 from the bottom surface. Here, the pads 612 and 636 can be used to connect or bond the microdevice to a system substrate. The passivation layer 640 extended over the bottom surface of the microdevice 600. The pad 612 can be smaller or larger than doped layer 608.

Figure 7A:
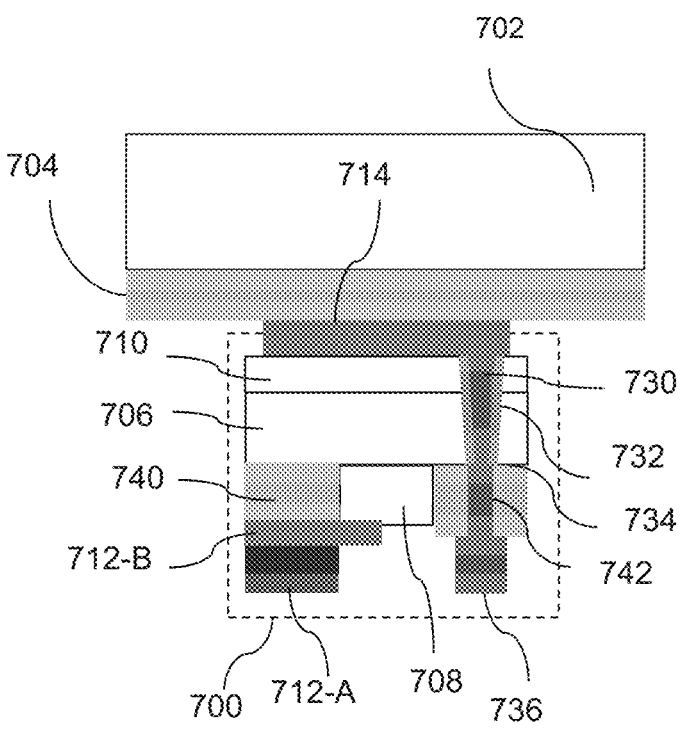
FIG. 7A shows a microdevice formed on a substrate with active layers, a VIA and doped layer and the contact pad with two parts.
Figure 7B:
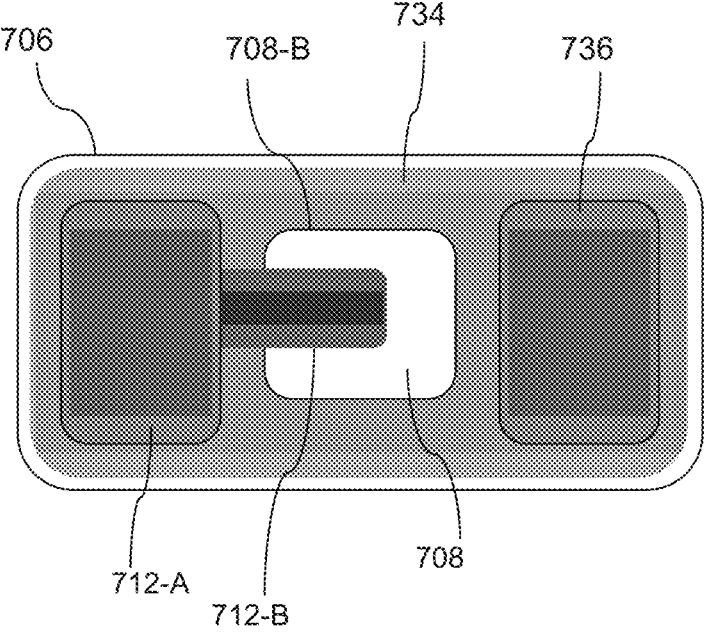
FIG. 7B shows a view of the microdevice in FIG. 7A from the bottom surface.
Figure 7C:
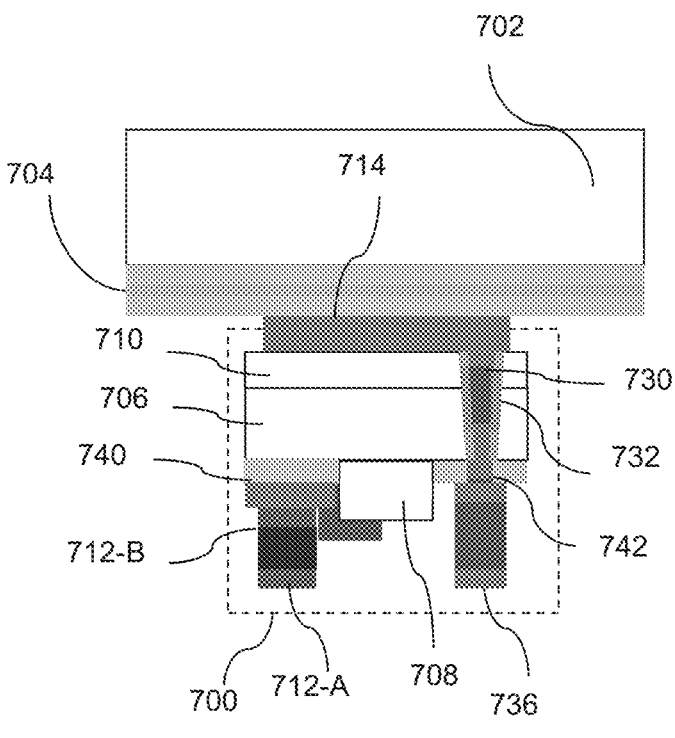
FIG. 7C shows a microdevice formed on a substrate with active layers, a VIA and doped layer and passivation layer extended over the bottom surface of the microdevice.

FIGS. 7A-7B, 7C presents a microdevice 700 formed on a substrate 702. Here, there can be a buffer/adhesion layer 704 between the microdevice 700 and the substrate 702. The microdevice has active layers 706 (multi quantum wells, blocking layers, etc.), between p and n doped layers 708 and 710. Contact layers 712 and 714 are formed on the surface of doped layers 708 and 710. The contacts 712 and 714 can be a combination of ohmic layers and pad/bonding layers. In this structure, one of the doped layers 708 and 710 (e.g. n layer) is smaller than the active layers 706. A planarization/passivation layer 740 can cover the bottom surface of the microdevice (it can leave the surface of the doped layer 708 exposed). Here, a VIA brings the contact from one side of the device to the other side wherein part of the VIA 742 is inside the planarization layer. The VIA is passivated with dielectric layer 732, and conductive layer 730 coupled to the doped layer 710 (or in case there is a contact layer 714, the conductive layer 730 is coupled to the contact layer 714). In case, where the conductive layer 730 coupled to the doped layer 710, it may contain an ohmic layer to create a better connection with the doped layer. And there will be no passivation between the conductive layer 730 and the doped layer 710.

If the VIA is formed from the top side (side corresponding to the doped layer 710), or it is formed from the bottom side (the side corresponding to the doped layer 708), there can be some conductive layer 730 remain outside the VIA at the bottom side after removing the doped layers from the VIA area. A pad 736 is formed to provide access to the conductive layer 730. The pad 736 is separated from the underneath layers by a dielectric layer 734. Here, the contact pad 712 has two parts 712-A and 712-B. The conductive layer 712-B connect the pad 712-A to the doped layer 708. The conductive layer 712-B may contain ohmic layers to provide better access to the doped layer 708.

FIG. 7B shows a view of the microdevice 700 from the bottom surface. Here, the pads 712 and 736 can be used to connect or bond the microdevice to a system substrate. The passivation layer 740 extended over the bottom surface of the microdevice 700. The pad 712 can be smaller or larger than doped layer 708. In FIG. 7C, the passivation layer 740 can be a dielectric.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

The invention claimed is:

1. A solid state microdevice structure comprising:
   a microdevice formed on a substrate, the microdevice comprising;
   a plurality of doped layers including at least a p doped layer and an n doped layer;
   active layers disposed between the plurality of doped layers wherein a first doped layer of the plurality of doped layers is coupled to, smaller than, and disposed within a perimeter of a first side of the active layers, and a second doped layer of the plurality of doped layers is coupled to a second side of the active layers, the first side of the active layers opposite the second side of the active layers;
   a VIA connecting one side of the microdevice structure to another side; and
   a plurality of pads including a first pad coupled to the first doped layer of the plurality of doped layers, a second pad coupled to one end of the VIA, and a third pad coupled to the other end of the VIA and disposed within a region of the microdevice structure located on the second side of the active layers and other than in contact with the first pad,
   wherein the VIA other than passes though the portion of the first doped layer coupled to the first pad.

2. The microdevice structure of claim 1, wherein the n doped layer is modulated to have a lower conductivity towards an edge of the microdevice structure.

3. The microdevice structure of claim 1, wherein a passivation layer is used to form on a surface or a sidewall of the n doped layer and an exposed surface of the active layers.

4. The microdevice structure of claim 3, wherein the passivation layer is a form of a metal insulator semiconductor (MIS) structure.

5. The microdevice structure of claim 1, wherein the active layers are multi-quantum wells or blocking layers.

6. The microdevice structure of claim 5, wherein the blocking layer is etched back to a size of the n doped layer.

7. The microdevice structure of claim 1, wherein an insulator layer, and a metal layer form a MIS structure.

8. The microdevice structure of claim 7, wherein the MIS structure is around the sidewall or surface of the n doped layer and also cover the active layers.

9. The microdevice structure of claim 8, wherein the MIS is biased with a voltage smaller than a threshold voltage of the MIS to reduce a leakage current.

10. The microdevice structure of claim 7, wherein the MIS structure is biased with a negative voltage to reduce a current through the sidewalls of the n doped layer.

11. The microdevice structure of claim 1, wherein the VIA is passivated with a dielectric layer and a conductive layer that is coupled to the n doped layer.

12. The microdevice structure of claim 11, wherein the conductive layer contains an ohmic layer to create a better connection with the n doped layer wherein further there is no passivation between the conductive layer and the n doped layer.

13. The microdevice structure of claim 11, wherein the VIA is formed from a top side of the microdevice structure or it is formed from a bottom side of the microdevice structure such that there is a part of the conductive layer remaining outside the VIA at the bottom side of the microdevice structure after removing the doped layers from the VIA area.

14. The microdevice structure of claim 13, wherein the second pad is formed to provide access to the conductive layer such that the second pad is separated from underneath layers by a dielectric layer.

15. The microdevice structure of claim 14, wherein at least a pad of the plurality of pads is used to connect or bond the microdevice structure to a system substrate and wherein further, the dielectric layer separating the at least a pad from the underneath layers can be extended over another part of a surface.

16. The microdevice structure of claim 15, wherein the at least a pad is smaller or larger than a doped layer.

17. The microdevice structure of claim 14, wherein if the second pad does not form an ohmic layer with p doped layer the dielectric layer is absent.

18. The microdevice structure of claim 14, wherein the underneath layers are parts of the p doped layer that can be used for staging or no use, wherein further, some of the parts of the p doped layer can be continuous, while other parts can be connected to a voltage for modulating an internal field for microdevice structure.

19. The microdevice structure of claim 14, wherein the second pad is connected through the conductive or the ohmic layer extending over a top of an intended area of the doped layer.

20. The microdevice structure of claim 1, wherein the p doped layer is patterned into several smaller areas and one of the areas is used for connecting to the microdevice structure through forming at least a pad on top of it while other areas can be used as stage for other parts.

21. The microdevice structure of claim 1, wherein a planarization or passivation layer covers a bottom surface of the microdevice structure wherein further it can leave the surface of a doped layer exposed.

22. The microdevice structure of claim 21, wherein the VIA connects one side of the microdevice structure to the other side of the microdevice structure wherein part of the VIA is inside the planarization layer.

23. The microdevice structure of claim 21, wherein the passivation layer is a dielectric.

24. The microdevice structure of claim 1, wherein a pad is smaller or larger than the p doped layer.

25. The microdevice structure of claim 1, wherein a pad on the p doped layer has two parts, a second conductive layer and an other another pad, wherein the second conductive layer connects the other pad to the p doped layer, wherein further the second conductive layer contains ohmic layers to provide better access to the p doped layer.

26. The microdevice structure of claim 1, wherein the n doped layer is smaller than an active layer.

* * * * *